United States Patent
Huang

(10) Patent No.: US 10,636,911 B1
(45) Date of Patent: Apr. 28, 2020

(54) FIN STRUCTURE AND METHOD FOR MANUFACTURING THE SAME

(71) Applicant: NANYA TECHNOLOGY CORPORATION, New Taipei (TW)

(72) Inventor: Teng-Yen Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/259,688

(22) Filed: Jan. 28, 2019

Related U.S. Application Data

(60) Provisional application No. 62/769,911, filed on Nov. 20, 2018.

(51) Int. Cl.
  *H01L 29/78* (2006.01)
  *H01L 21/762* (2006.01)
  *H01L 29/66* (2006.01)

(52) U.S. Cl.
  CPC ...... *H01L 29/785* (2013.01); *H01L 21/76224* (2013.01); *H01L 21/76243* (2013.01); *H01L 21/76294* (2013.01); *H01L 29/66795* (2013.01)

(58) Field of Classification Search
  CPC ............. H01L 29/785; H01L 29/66795; H01L 21/76224; H01L 21/76243; H01L 21/76294
  See application file for complete search history.

(56) References Cited

U.S. PATENT DOCUMENTS

| | | | |
|---|---|---|---|
| 2014/0264725 A1* | 9/2014 | Chuang | H01L 29/0649 257/510 |
| 2015/0144999 A1* | 5/2015 | Ching | H01L 29/66795 257/190 |
| 2017/0358645 A1 | 12/2017 | Dewey et al. | |
| 2018/0247939 A1 | 8/2018 | Glass et al. | |

FOREIGN PATENT DOCUMENTS

TW  201836155 A  10/2018

* cited by examiner

*Primary Examiner* — Dale E Page
*Assistant Examiner* — Quovaunda Jefferson
(74) *Attorney, Agent, or Firm* — Muncy, Geissler, Olds & Lowe, P.C.

(57) ABSTRACT

The present disclosure relates to a fin structure and a method for manufacturing the same. The fin structure includes a substrate and at least one fin block. The fin block is disposed on the substrate. The fin block includes an isolation layer and a top fin layer. The isolation layer is disposed on the substrate. The top fin layer is disposed on the isolation layer. At least a portion of the top fin layer is exposed. The top fin layer is an epitaxial layer. The isolation layer is in contact with the top fin layer.

6 Claims, 6 Drawing Sheets

US 10,636,911 B1

FIN STRUCTURE AND METHOD FOR MANUFACTURING THE SAME

PRIORITY CLAIM AND CROSS-REFERENCE

This application claims the priority benefit of U.S. provisional application Ser. No. 62/769,911, filed on Nov. 20, 2018. The entirety of the above-mentioned patent application is hereby incorporated by reference herein and made a part of this specification.

TECHNICAL FIELD

The present disclosure relates to a fin structure and a method for manufacturing the same, and more particularly, to a fin structure for a fin field-effect transistor (FinFET) and a method for manufacturing the same.

DISCUSSION OF THE BACKGROUND

Semiconductor devices are essential for many modern applications. With the advancement of electronic technology, semiconductor devices are steadily becoming smaller while providing greater functionality and including greater amounts of integrated circuits. Due to the miniaturized scale of semiconductor devices, fin structures are widely used in field-effect transistors.

To prevent a current leakage, a conventional fin structure is provided. The fin structure includes a substrate, and a fin block extending from the substrate. The fin includes an isolation layer and a top fin layer. The isolation layer can electrically isolate the top fin layer from the substrate.

However, a method for manufacturing a conventional fin structure includes many complicated steps and consumes large amounts of time and materials.

The isolation layer of the fin block is formed through a doping process or an oxidation process. During the process of forming the isolation layer, a protective cladding layer is deposited around the top fin layer to prevent the top fin layer from oxidization. After the forming of the isolation layer, the protective cladding layer is removed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a method for manufacturing a fin structure. The method comprises steps of: providing a substrate; forming at least one recess in an upper portion of the substrate; forming a fin block in the at least one recess, wherein the fin block includes an isolation layer and a top fin layer over the isolation layer; and removing a portion of the substrate to expose the top fin layer.

In some embodiments, the substrate is a monocrystalline silicon layer.

In some embodiments, the isolation layer includes oxide material formed through a deposition process.

In some embodiments, the top fin layer is formed through an epitaxial growth process.

In some embodiments, the top fin layer includes epitaxial monocrystalline silicon material.

In some embodiments, the portion of the substrate is removed by an etching process.

In some embodiments, the isolation layer electrically isolates the top fin layer from a base portion of the substrate.

In some embodiments, the top fin layer is formed after the forming of the isolation layer.

Another aspect of the present disclosure provides a method for manufacturing a fin structure, the method comprising steps of: forming an upper portion on a base portion; forming at least one recess in the upper portion; forming a fin block in the at least one recess; forming an isolation layer in the fin block; and removing at least a portion of the upper portion to expose at least a portion of the fin block.

In some embodiments, the fin block includes a top fin layer over the isolation layer, and the top fin layer is exposed after removing at least the portion of the upper portion.

In some embodiments, the base portion is a silicon substrate layer, and the upper portion includes dielectric material formed through a deposition process.

In some embodiments, the isolation layer includes oxide material formed through a separation by implantation of oxygen (SIMOX) process.

In some embodiments, the upper portion is removed by an etching process.

In some embodiments, the fin block in the at least one recess is formed through a selective epitaxial growth (SEG) process.

In some embodiments, the isolation layer electrically isolates the top fin layer from the base portion.

Another aspect of the present disclosure provides a fin structure, the fin structure comprising: a substrate; and at least one fin block disposed on the substrate, wherein the fin block includes an isolation layer and a top fin layer, the isolation layer is disposed on the substrate, the top fin layer is disposed on the isolation layer, at least a portion of the top fin layer is exposed, the top fin layer is an epitaxial layer, and the isolation layer is in contact with the top fin layer.

In some embodiments, the top fin layer includes epitaxial mono crystalline silicon material, and the isolation layer is in contact with a base portion of the substrate.

In some embodiments, the substrate further includes a base portion and an upper portion disposed on the base portion, the upper portion includes at least one recess, and a portion of each of the at least one fin block is disposed in the at least one recess.

In some embodiments, the upper portion and the base portion are integrally formed from monocrystalline silicon material.

In some embodiments, the upper portion is a dielectric layer, and the base portion is a monocrystalline silicon substrate layer.

With the design of the fin structure, the method for manufacturing the fin structure is simpler. The present fin structure can be manufactured without many steps, such as a doping process, an oxidation process, or a process for depositing a protective cladding layer.

The foregoing has outlined rather broadly the features and technical advantages of the present disclosure in order that the detailed description of the disclosure that follows may be better understood. Additional features and advantages of the disclosure will be described hereinafter and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
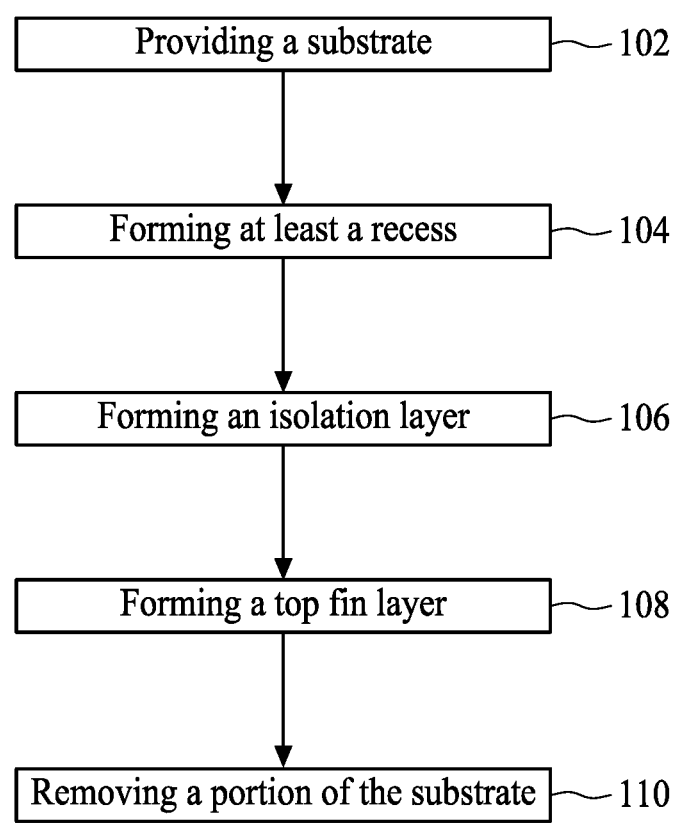
FIG. 1 is a flow diagram illustrating a method for manufacturing a fin structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

References to "one embodiment," "some embodiments," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprise" and "comprising," when used in this specification, point out the presence of stated features, integers, steps, operations, elements, or components, but do not preclude the presence or addition of one or more other features, integers, steps, operations, elements, components, or groups thereof.

FIG. 1 is a flow diagram illustrating a method 100 for manufacturing a fin structure 200 in accordance with some embodiments of the present disclosure. FIGS. 2 to 5 are schematic cross-sectional views of stages of manufacturing a fin structure 200 in accordance with some embodiments of the present disclosure. In some embodiments, the method 100 includes a number of operations (102, 104, 106, 108, and 110), and the description and illustration below are not deemed as a limitation to the sequence of the operations.

Figure 2:
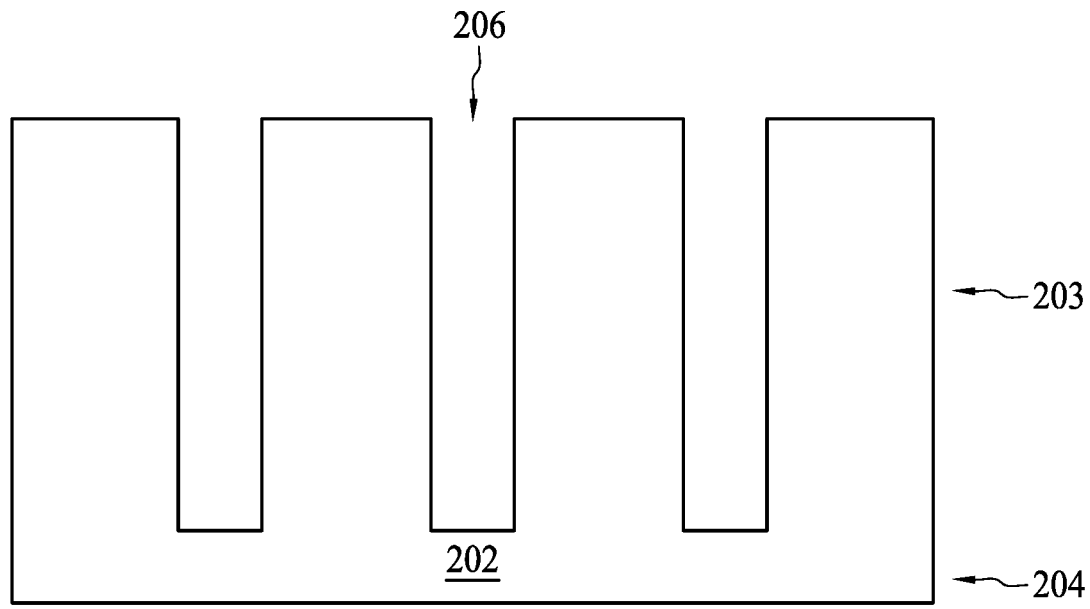
FIGS. 2 to 5 are schematic cross-sectional views during stages of manufacturing a fin structure by the method of FIG. 1 in accordance with some embodiments of the present disclosure.

As shown in FIG. 2, in operation 102, a substrate 202 is provided. In some embodiments, the substrate 202 is a monocrystalline silicon layer. In some embodiments, the substrate 202 is a bulk silicon substrate, a bulk ceramic substrate, a silicon on insulator (SOI) substrate, or the like.

In operation 104, as shown in FIG. 2, at least one recess 206 is formed in an upper portion 203 of the substrate 202. In some embodiments, a plurality of recesses 206 are formed. In some embodiments, the forming of a plurality of recesses is for preparing a fin structure for a multiple-fin field-effect transistor (FET).

In some embodiments, the recess 206 is formed in the substrate 202 through any suitable recessing process, such as a wet etching process, a dry etching process, or the like.

Figure 3:
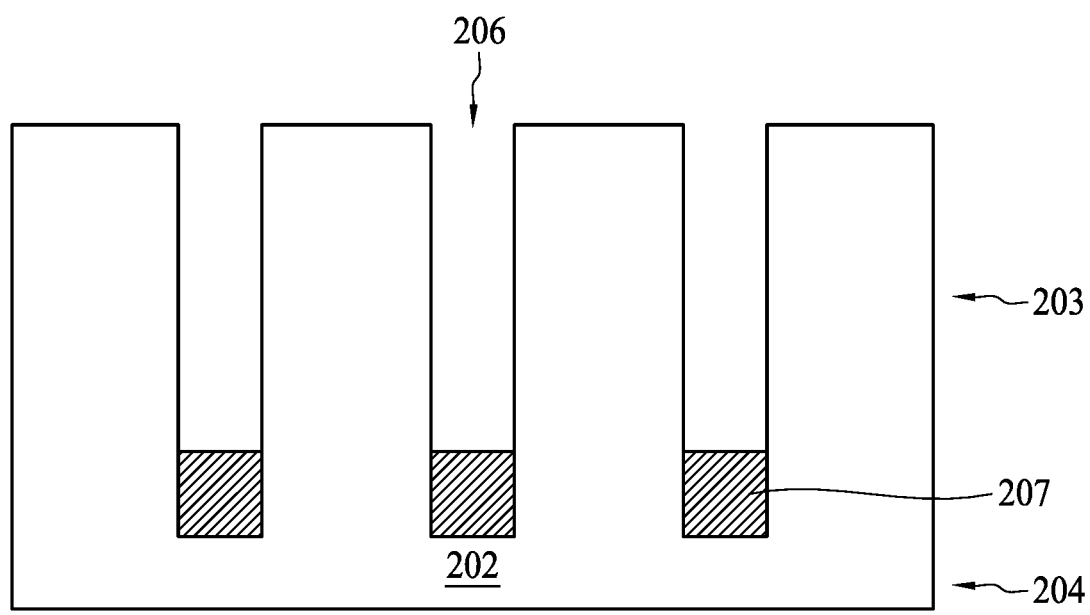

In operation 106, as shown in FIG. 3, an isolation layer 207 is formed in the recess 206. In some embodiments, the isolation layer 207 includes oxide material formed through any suitable deposition process, such as chemical vapor deposition (CVD), physical vapor deposition (PVD), or the like.

Figure 4:
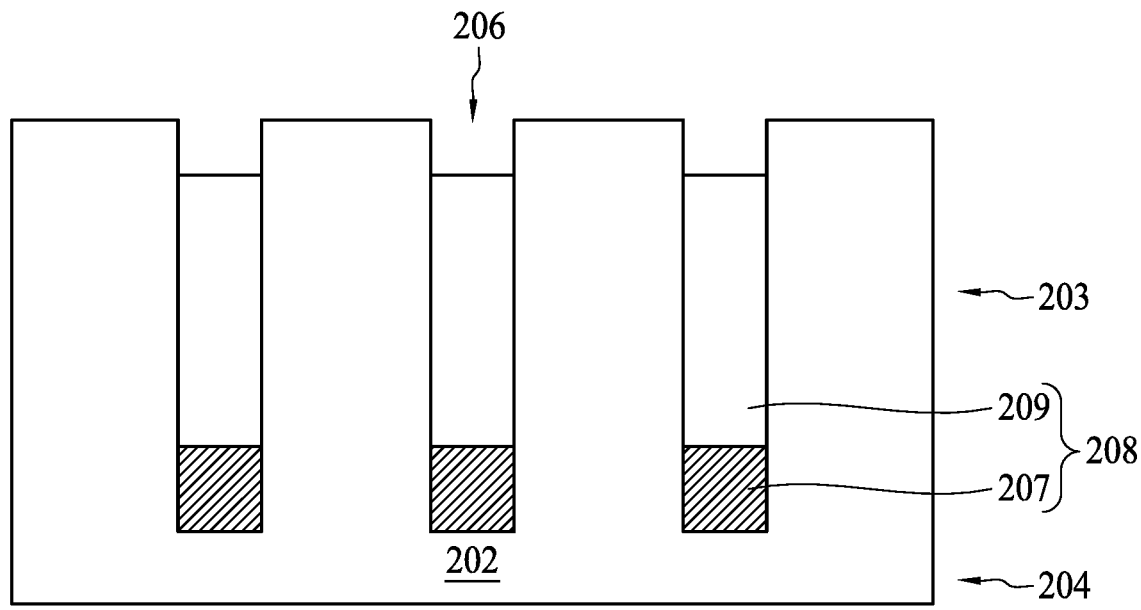

In operation 108, as shown in FIG. 4, a top fin layer 209 is formed over the isolation layer 207 after the forming of the isolation layer 207. Accordingly, a fin block 208 is formed in the at least one recess 206. The fin block 208 includes the isolation layer 207 and the top fin layer 209 over the isolation layer 207.

In some embodiments, the top fin layer 209 includes epitaxial monocrystalline silicon material. In some embodiments, the top fin layer 209 is formed through an epitaxial growth process.

With the isolation layer 207 of the fin block 208 over a base portion 204 of the substrate 202, the isolation layer 207 electrically isolates the top fin layer 209 from the base portion 204 of the substrate 202. Therefore, the isolation layer 207 can reduce risk of current leakage.

Figure 5:
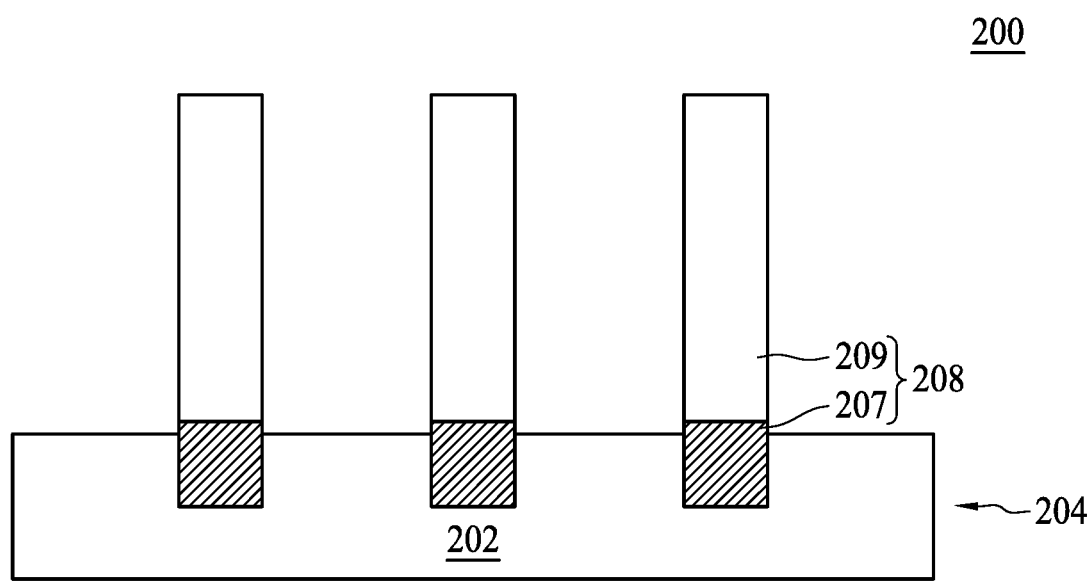

In operation 110, as shown in FIG. 5, a portion of the substrate 202 is removed to expose at least a portion of the fin block 208. In some embodiments, a portion of the upper portion 203 is removed to expose a portion of the top fin layer 209. In some embodiments, the upper portion 203 is removed completely to expose the top fin layer 209 completely.

In some embodiments, the portion of the substrate 202 is removed through any suitable etching process, such as a wet etching process, a dry etching process, or the like.

In some embodiments, a shallow trench isolation process is performed to electrically isolate the fin structure 200 from another fin structure adjacent to the fin structure 200.

In some embodiments, a gate structure is formed over the top fin layer 209 to obtain a fin field-effect transistor (FinFET).

Through the operations (102, 104, 106, 108 and 110), the fin structure 200 is provided, as shown in FIG. 5. The fin structure 200 includes the substrate 202, and at least a fin block 208 disposed on the substrate 202.

In some embodiments, the substrate 202 is a monocrystalline silicon layer. In some embodiments, the substrate 202 is a bulk silicon substrate, or the like.

In some embodiments, the fin block 208 includes the isolation layer 207 and the top fin layer 209. The isolation layer 207 is disposed on the substrate 202.

In some embodiments, the isolation layer 207 includes oxide material formed through any suitable deposition process, such as chemical vapor deposition (CVD), physical vapor deposition (PVD), or the like.

The top fin layer 209 is disposed on the isolation layer 207. At least the portion of the top fin layer 209 is exposed. In some embodiments, the top fin layer 209 is an epitaxial layer. In some embodiments, the isolation layer 207 is in contact with the top fin layer 209.

In some embodiments, the top fin layer 209 includes epitaxial monocrystalline silicon material. In some embodiments, the top fin layer 209 is formed through an epitaxial growth process.

In some embodiments, the upper portion 203 and the base portion 204 are integrally formed from monocrystalline silicon material. In some embodiments, the isolation layer 207 is in contact with the base portion 204 of the substrate 202 and the top fin layer 209.

In some embodiments, the isolation layer 207 electrically isolates the top fin layer 209 from the base portion 204 of the substrate 202. Therefore, the isolation layer 207 can reduce risk of current leakage.

In some embodiments, the substrate 202 includes the base portion 204 and the upper portion 203 disposed on the base portion 204. The upper portion 203 includes the plurality of recesses 206, and the portion of each fin block 208 is disposed in the at least one recess 206.

In some embodiments, the plurality of recesses 206 are formed through any suitable recessing process, such as a wet etching process, a dry etching process, or the like.

Figure 6:
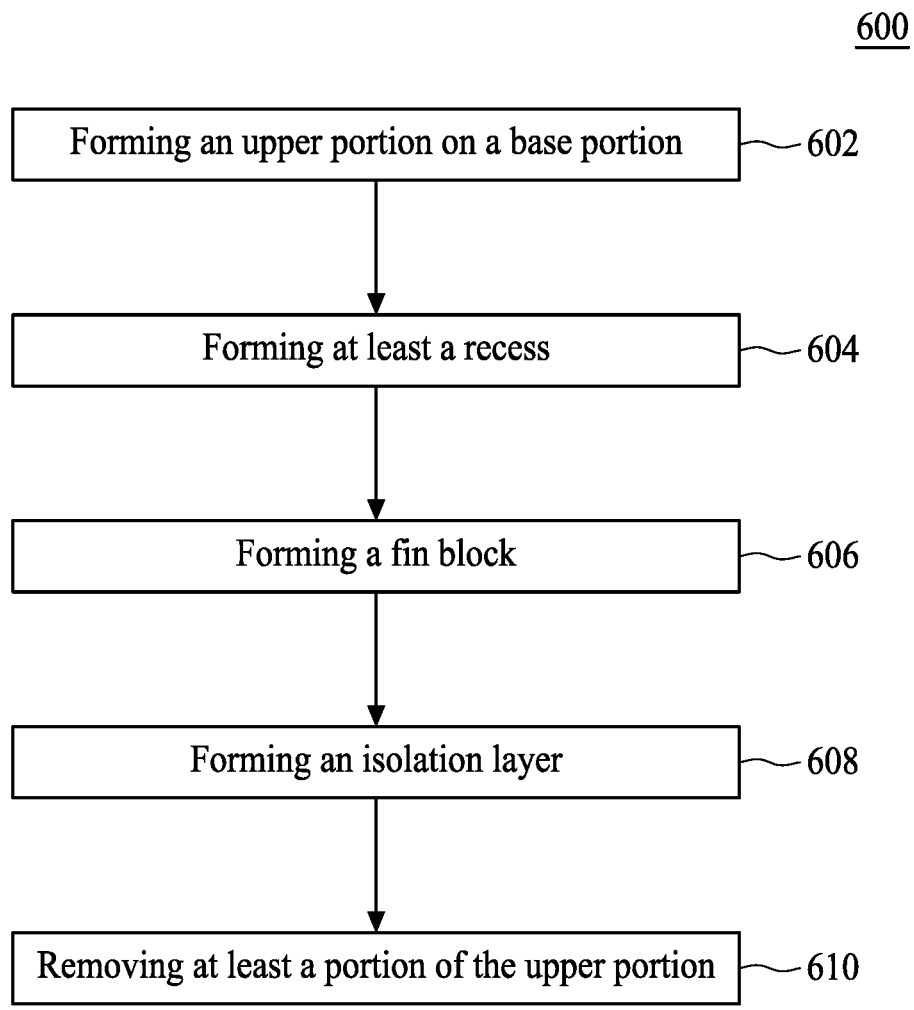
FIG. 6 is a flow diagram illustrating a method for manufacturing a fin structure in accordance with some embodiments of the present disclosure.

FIG. 6 is a flow diagram illustrating a method 600 for manufacturing a fin structure in accordance with some embodiments of the present disclosure. FIGS. 7 to 10 are schematic cross-sectional views of stages of manufacturing a fin structure in accordance with some embodiments of the present disclosure. In some embodiments, the method 600 includes a number of operations (602, 604, 606, 608, and 610), and the description and illustration below are not deemed as a limitation to the sequence of the operations.

Figure 7:
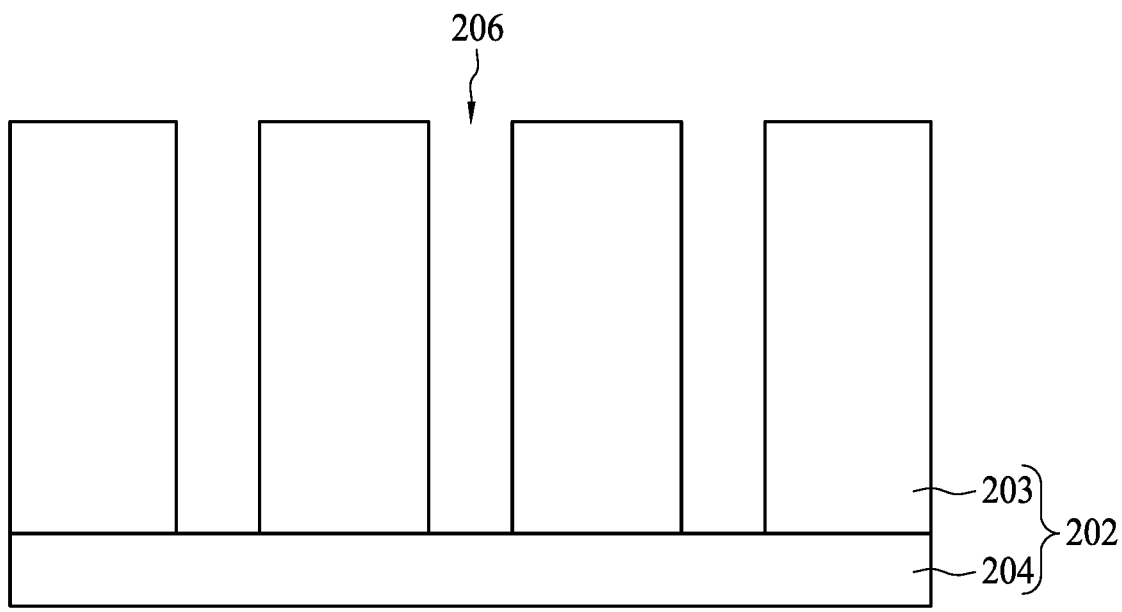
FIGS. 7 to 10 are schematic cross-sectional views during stages of manufacturing a fin structure by the method of FIG. 6 in accordance with some embodiments of the present disclosure.

As shown in FIG. 7, in operation 602, an upper portion 203 is formed on a base portion 204. In some embodiments, a substrate 202 includes the upper portion 203 and the base portion 204.

In some embodiments, the base portion 204 of the substrate 202 is a silicon substrate layer. In some embodiments, the base portion 204 of the substrate 202 is a monocrystalline silicon layer.

In some embodiments, the base portion 204 of the substrate 202 is a bulk silicon substrate, a ceramic substrate, a silicon on insulator substrate (501), or the like.

In some embodiments, the upper portion 203 includes dielectric material, such as oxide, or the like. The upper portion 203 is formed through a deposition process, such as a physical vapor deposition (PVD) process or a chemical vapor deposition (CVD) process, or the like.

As shown in FIG. 7, in operation 604, at least one recess 206 is formed in the upper portion 203 of the substrate 202.

In some embodiments, a plurality of said recesses 206 are formed through any suitable recessing process, such as a wet etching process, a dry etching process, or the like.

Figure 8:
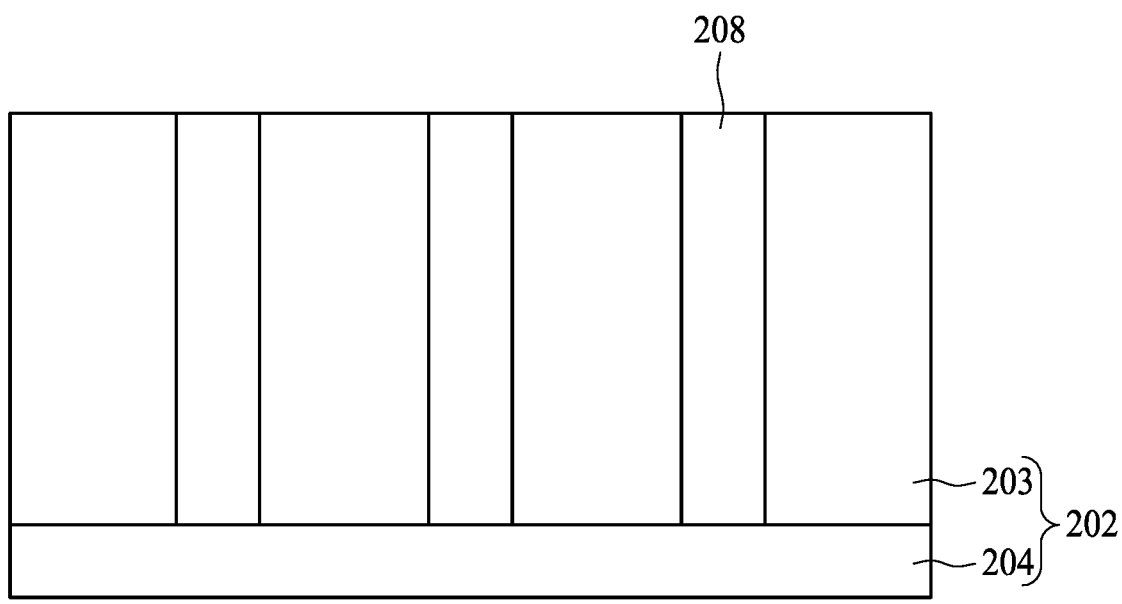

As shown in FIG. 8, in operation 606, a fin block 208 is formed in the at least one recess 206. In some embodiments, the fin block 208 in the at least one recess 206 is formed through a selective epitaxial growth (SEG) process. In some embodiments, the fin block 208 includes epitaxial monocrystalline silicon material.

Figure 9:
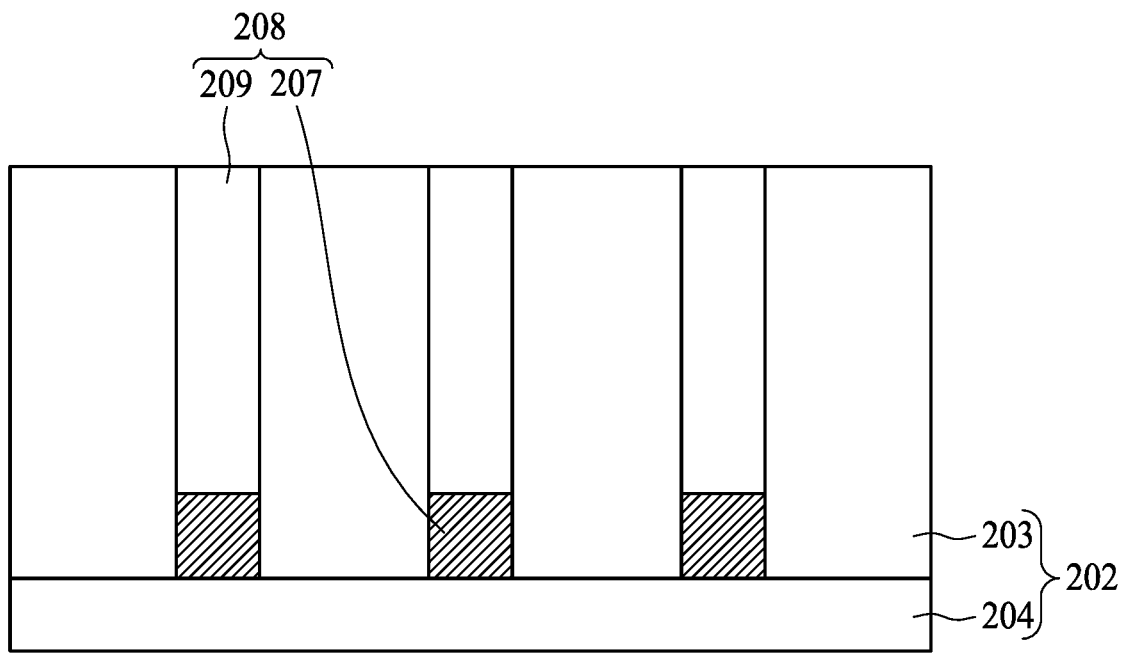

As shown in FIG. 9, in operation 608, an isolation layer 207 is formed in the fin block 208. After the operation 608, the fin block 208 includes the top fin layer 209 over the isolation layer 207. The isolation layer 207 includes oxide material.

In some embodiments, the isolation layer 207 is converted from a portion of silicon material of the fin block through a separation by implantation of oxygen (SIMOX) process. In the SIMOX process, the isolation layer 207 is formed by an oxygen ion beam implantation process followed by a high temperature annealing process to create a buried silicon dioxide layer in the fin block 208.

The isolation layer 207 electrically isolates the top fin layer 209 from the base portion 204. Therefore, the isolation layer 207 can reduce risk of current leakage between the top fin layer and the base portion 204 of the substrate 202.

Figure 10:
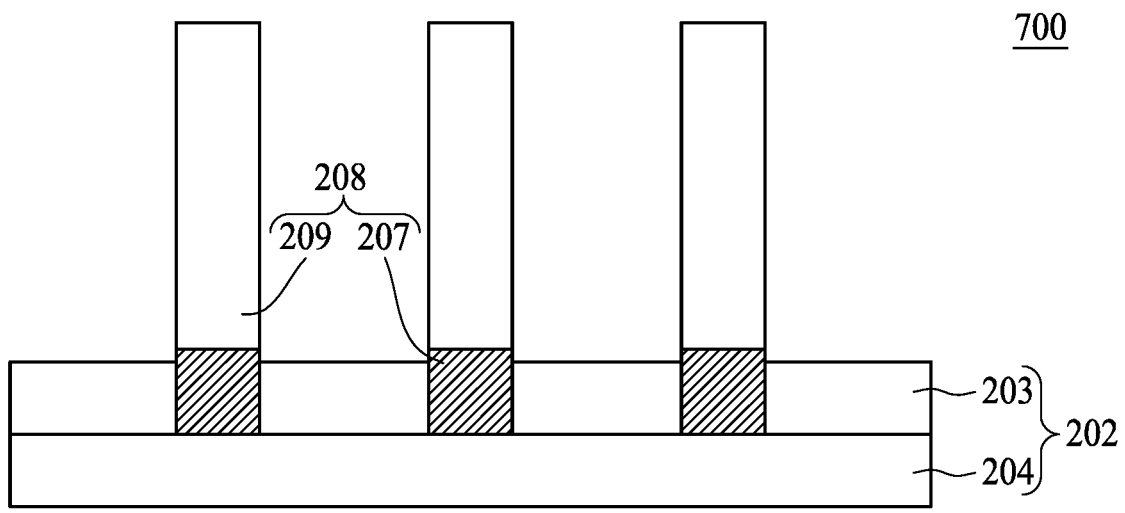

As shown in FIG. 10, in operation 610, at least a portion of the upper portion 203 is removed to expose at least a portion of the fin block 208.

In some embodiments, a portion of the upper portion 203 is removed to expose at least a portion of the top fin layer 209. In some embodiments, the upper portion 203 is removed completely to expose the top fin layer 209 completely.

In some embodiments, the upper portion 203 is removed through any suitable etching process, such as a wet etching process, a dry etching process, or the like.

In some embodiments, a shallow trench isolation process is performed to electrically isolate the fin structure 700 from another fin structure adjacent to the fin structure 700.

In some embodiments, a gate structure is formed over the top fin layer 209 to obtain a fin field-effect transistor (FinFET).

Through the operations (602, 604, 606, 608 and 610) the fin structure 700 is provided, as shown in FIG. 10. The fin structure 700 includes the substrate 202 and at least a fin block 208 disposed on the substrate 202.

The fin block 208 includes the isolation layer 207 and the top fin layer 209. The isolation layer 207 is disposed on the substrate 202. The top fin layer 209 is disposed on the isolation layer 207.

In some embodiments, the top fin layer 209 of the fin block 208 includes epitaxial monocrystalline silicon material. In some embodiments, the isolation layer 207 of the fin block 208 is in contact with the base portion 204 of the substrate 202 and the top fin layer 209 of the fin block 208.

At least the portion of the top fin layer 209 is exposed. The top fin layer 209 is an epitaxial layer. In some embodiments, the isolation layer 207 is in contact with the top fin layer 209.

In some embodiments, the isolation layer 207 of the fin block 208 includes oxide material. In some embodiments, the top fin layer 209 of the fin block 208 includes epitaxial monocrystalline silicon material.

In some embodiments, the isolation layer 207 is converted from a portion of the fin block through a separation by implantation of oxygen (SIMOX) process. In the SIMOX process, the isolation layer 207 is formed using an oxygen ion beam implantation process followed by a high temperature annealing process to create a buried silicon dioxide layer in the fin block 208.

The isolation layer 207 electrically isolates the top fin layer 209 from the base portion 204. Therefore, the isolation layer 207 can reduce risk of current leakage between the top fin layer and the base portion 204 of the substrate 202.

The substrate 202 includes the base portion 204 and the upper portion 203 disposed on the base portion 204. In some embodiments, the upper portion 203 is a dielectric layer.

In some embodiments, the upper portion 203 includes dielectric material, such as oxide, or the like. In some embodiments, the upper portion 203 is formed through a deposition process, such as a physical vapor deposition (PVD) process or a chemical vapor deposition (CVD) process, or the like.

In some embodiments, the base portion 204 is a monocrystalline silicon substrate layer. In some embodiments, the base portion 204 is a silicon substrate layer. In some embodiments, the base portion 204 of the substrate 202 is a monocrystalline silicon layer. In some embodiments, the base portion 204 of the substrate 202 is a bulk silicon substrate, a ceramic substrate, a silicon on insulator substrate (SOI), or the like.

The upper portion 203 includes at least a recess 206. In some embodiments, the portion of each of the at least one fin block 208 is disposed in the at least one recess 206. In some embodiments, a plurality of recesses 206 are formed through any suitable recessing process, such as a wet etching process, a dry etching process, or the like.

In conclusion, with the configuration of the fin structure, the method for manufacturing the fin structure is simpler. The present fin structure can be manufactured without many steps, such as a doping process, an oxidation process, or a process for depositing a protective cladding layer.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

One aspect of the present disclosure provides a method for manufacturing a fin structure, the method comprising steps of: providing a substrate; forming at least one recess in an upper portion of the substrate; forming a fin block in the at least one recess, wherein the fin block includes an isolation layer and a top fin layer over the isolation layer; and removing a portion of the substrate to expose the top fin layer.

Another aspect of the present disclosure provides a method for manufacturing a fin structure, the method comprising steps of: forming an upper portion on a base portion; forming at least one recess in the upper portion; forming a fin block in the at least one recess; forming an isolation layer in the fin block; and removing at least a portion of the upper portion to expose at least a portion of the fin block.

Another aspect of the present disclosure provides a fin structure, the fin structure comprising: a substrate; and at least one fin block disposed on the substrate, wherein the fin block includes an isolation layer and a top fin layer, the isolation layer is disposed on the substrate, the top fin layer is disposed on the isolation layer, at least a portion of the top fin layer is exposed, the top fin layer is an epitaxial layer, and the isolation layer is in contact with the top fin layer.

The scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for manufacturing a fin structure, comprising:
providing a substrate;
forming at least one recess in an upper portion of the substrate;
forming a fin block in the at least one recess, wherein the fin block comprises an isolation layer and a top fin layer over the isolation layer; and
removing a portion of the substrate to expose at least a portion of the fin block;
wherein the top fin layer is formed through an epitaxial growth process;
wherein the top fin layer comprises epitaxial monocrystalline silicon material.

2. The method of claim 1, wherein the substrate is a monocrystalline silicon layer.

3. The method of claim 1, wherein the isolation layer comprises oxide material formed through a deposition process.

4. The method of claim 1, wherein the portion of the substrate is removed by an etching process.

5. The method of claim 1, wherein the isolation layer electrically isolates the top fin layer from a base portion of the substrate.

6. The method of claim 1, wherein the top fin layer is formed after the forming of the isolation layer.

* * * * *